United States Patent [19]

Kumamoto et al.

[11] Patent Number: 4,827,262
[45] Date of Patent: May 2, 1989

[54] COMPARATOR BANK OF A/D CONVERTER

[75] Inventors: Toshio Kumamoto; Masao Nakaya, both of Itami, Japan

[73] Assignee: Mitsubishi Denki Kabushiki Kaisha, Japan

[21] Appl. No.: 76,858

[22] Filed: Jul. 23, 1987

[30] Foreign Application Priority Data

Jul. 29, 1986 [JP] Japan .................. 61-179530

[51] Int. Cl.[4] .................. H03M 1/78; H03M 1/36
[52] U.S. Cl. .................. 341/158; 357/68; 341/159
[58] Field of Search ........... 357/68, 40; 340/347 AD; 341/133, 134, 155, 159

[56] References Cited

U.S. PATENT DOCUMENTS 3,365,707  1/1968  Mayhew .................. 357/68

OTHER PUBLICATIONS

"WAM 2.7: CMOS 8b 25MHz Flash ADC", Tsukada et al, IEEE International Solid-State Circuits Conference, 1985.
"Monolithic Expandable 6 Bit 20MHz CMOS/SOS A/D Converter", Dingwall, IEEE Hournal of Solid-State Circuits, vol. SC 14, No. 6, pp. 926-932, Dec. 1979.

Primary Examiner—William M. Shoop, Jr.
Assistant Examiner—Gary J. Romano
Attorney, Agent, or Firm—Leydig, Voit & Mayer

[57] ABSTRACT

A comparator bank of an A/D converter comprising a plurality of comparators arranged into rows in a foldedback shape and a supply voltage line and a ground line in parallel with each other and connected to the comparators to provide reference potentials thereto according to a distribution shape which rises and falls continuously along the rows of the comparators whereby the linearity of the A/D converter is effectively maintained. The nodes of the comparators do not intersect and are arranged to successively become further from reference points set at the terminals of the supply voltage and ground lines.

2 Claims, 1 Drawing Sheet

COMPARATOR BANK OF A/D CONVERTER

BACKGROUND OF THE INVENTION

The present invention relates to a comparator bank of an A/D (analog-to-digital) converter.

A conventional 8-bit flash A/D converter is shown in FIG. 2. FIG. 3 is a view showing the comparator bank of the A/D converter, which is folded back into four rows in this example. In the figures, letters A, B, C and D indicate the individual comparator rows, and numerals 1 and 64, numerals 65 and 128, numerals 129 and 192 and numerals 193 and 256 indicate comparators which lie at both the ends of the corresponding comparator rows. Letter L in FIG. 2 denotes the layout of ladder resistors which constitute a ladder circuit for supplying the respective comparators with reference tap voltages. That is, a predetermined reference voltage is divided, and the resulting reference tap voltage are applied to the comparators 1-256 in the order of lower voltages. In addition, symbols GND and VDD denote the layouts of a ground line and a supply voltage line which form feeder lines to the individual comparators, respectively.

In the A/D converter thus constructed, all the comparators simultaneously compare an input voltage with the reference tap voltages produced by the ladder circuit L, and the results are used for generating a converted digital code.

A similar A/D converter is of the CMOS type and disclosed in an article entitled "WAM 2.7: CMOS 8b 25 MHz Flash ADC," by Tsukada et al, Published in IEEE, ISSCC Digest, 1985.

As shown in FIG. 2, the prior-art A/D converter has the following problem. Since the ground line GND and the supply voltage line VDD are branched at the folded-back parts of the comparator bank, the potential distribution of the comparators becomes irregular. The individual comparators operated with the irregular potentials exhibit characteristics different from one another, and especially, the characteristics are greatly different between the comparators adjoining at the folded-back parts of the comparator bank (between, for example, the adjacent comparators 64 and 65, 128 and 129, and 192 and 193). In consequence, the linearity of the A/D converter is impaired as a whole.

SUMMARY OF THE INVENTION Accordingly, it is an object of the present invention to provide an A/D converter having a comparator arrangement capable of maintaining favorable linearity.

In order to accomplish the object, the supply voltage line and the ground line which are connected to individual comparators arranged in rows are laid out in parallel.

Thus, according to this invention, the potential distribution of the comparators is in a shape which rises continuously or falls continuously along the rows of these comparators.

DESCRIPTION OF THE PREFERRED EMBODIMENT

Figure 1:
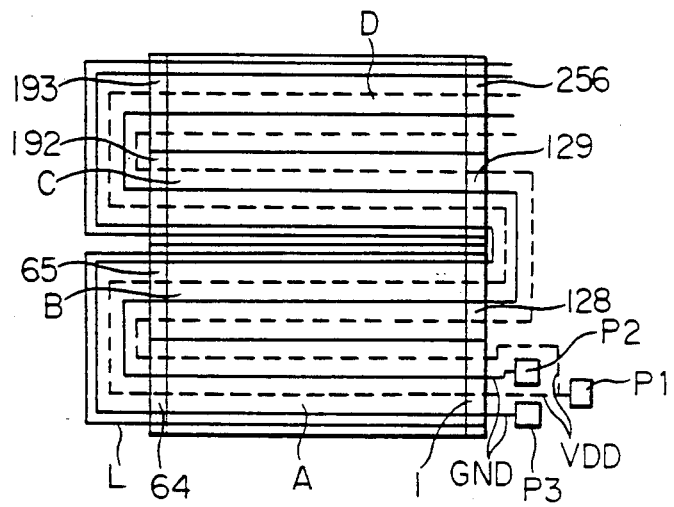
FIG. 1 is a layout diagram of a supply voltage line and a ground line showing an embodiment of the comparator bank of an A/D converter according to the present invention.
Figure 2:
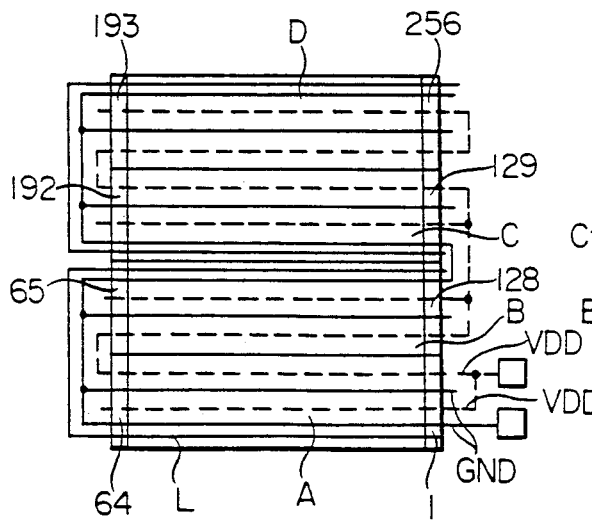
FIG. 2 is a layout diagram of a supply voltage line and a ground line in the comparator bank of an A/D converter in a prior art.
Figure 3:
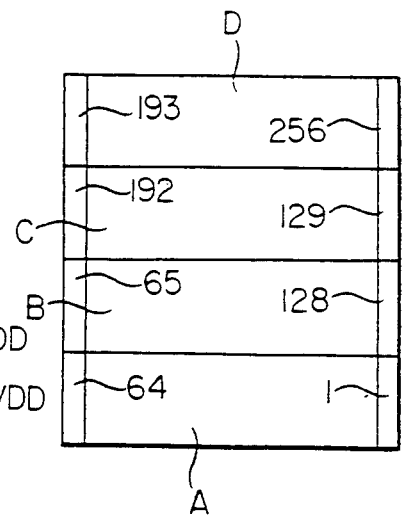
FIG. 3 is a diagram showing the comparator bank of the A/D converter in FIG. 2.

Now, the comparator bank of an A/D converter according to the present invention will be described. FIG. 1 is a layout diagram of a supply voltage line and a ground line showing one embodiment of the comparator bank of the A/D converter. In the figure, the same symbols as in FIGS. 2 and 3 denote identical constituents, and they shall be omitted from the description. In the embodiment, the ground line GND and the supply voltage line VDD are not branched at the folded-back parts of the respective comparator rows A, B, C and D, but they are laid in parallel with the ladder circuit L. That is, the nodes of the comparators 1-256 to be connected with the supply voltage line VDD and the ground line GND are laid out in such a way that they do not intersect and to successively become further from reference points set at the terminal P1 of the supply voltage line VDD and the terminals P2, P3 of the ground line GND.

Accordingly, the potential distribution of the comparators 1-256 changes continuously along these comparators, and the adjacent comparators are respectively operated by such supply voltages and the ground potential even at the folded-back parts of the comparator rows A, B, C and D. Thus, the adjacent comparators exhibit similar characteristics, and the linearity of the whole A/D converter is enhanced.

Although, in the embodiment the constituent comparators are divided into the rows A, B, C and D in the folded-back configuration, it is clear that an A/D converter constructed in a single row without folding back the comparator rows can have the linearity thereof enhanced by a similar layout. It is also clear that an A/D converter in which the comparators 1-256 are laid out so as to successively become nearer with the reference points set at the pad P1 of the supply voltage line VDD and the pads P2, P3 of the ground line GND, can have the linearity thereof enhanced similarly.

Besides, although the 8-bit flash A/D converter has been exemplified in the embodiment, the same effect is achieved for any flash A/D converter without regard to the number of bits. Further, the same effect is achieved for an A/D converter having blocks in each of which comparators are arranged in a plurality of rows.

As described above, in the comparator bank of an A/D converter according to the prsent invention, a supply voltage line and a ground line which are connected to individual comparators arranged in rows are laid out in parallel. Therefore, the potential distribution of the comparators demonstrates a shape which rises continuously or falls continuously along these comparators, and the linearity of the entire A/D converter can be improved.

What is claimed is:

1. A comparator bank of an A/D converter comprising:
    a plurality of comparators (1 to n) arranged into rows in a folded-back order, such that the comparators are in an ordered sequence (1 to n) in said rows which changes direction in successive rows;

a resistor ladder circuit paralleling the folded-back rows of comparators for supplying sequentially tapped reference voltages to the respective comparators; and a supply voltage bus including a pair of parallel unbranched supply voltage lines, and a ground bus including a pair of parallel unbranched ground lines interleaved with the supply voltage lines, all four of said lines running in parallel with each other and with the resistor ladder circuit and sequentially connected to said plurality of comparators in folded-back order to provide supply potentials thereto according to a distribution shape which rises or falls continuously along said rows of said comparators whereby linearity of said A/D converter is maintained.

2. A comparator bank of an A/D converter as defined in claim 1 wherein nodes of said comparators are connected to said supply voltage lines and to said ground lines in a noncrossing configuration and at points which successively become further from terminals of said supply voltage and ground lines.

* * * * *